(12) United States Patent
Elsherbini et al.

(10) Patent No.: US 11,728,290 B2
(45) Date of Patent: Aug. 15, 2023

(54) WAVEGUIDE FAN-OUT

(71) Applicant: Intel Corporation, Santa Clara, CA (US)

(72) Inventors: Adel A. Elsherbini, Chandler, AZ (US); Georgios Dogiamis, Chandler, AZ (US); Johanna M. Swan, Scottsdale, AZ (US); Aleksandar Aleksov, Chandler, AZ (US); Telesphor Kamgaing, Chandler, AZ (US); Henning Braunisch, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 962 days.

(21) Appl. No.: 16/394,514

(22) Filed: Apr. 25, 2019

(65) Prior Publication Data
US 2020/0303327 A1 Sep. 24, 2020

(30) Foreign Application Priority Data
Mar. 22, 2019 (GR) .............................. 20190100140

(51) Int. Cl.
*H01L 23/66* (2006.01)
*H01L 23/538* (2006.01)
*H01L 25/065* (2023.01)
*H01L 23/00* (2006.01)
*H01L 21/48* (2006.01)
*H01L 21/683* (2006.01)
*H01L 25/00* (2006.01)

(52) U.S. Cl.
CPC ............ *H01L 23/66* (2013.01); *H01L 21/486* (2013.01); *H01L 21/4857* (2013.01); *H01L 21/6835* (2013.01); *H01L 23/5386* (2013.01); *H01L 24/16* (2013.01); *H01L 25/0655* (2013.01); *H01L 25/50* (2013.01); *H01L 24/97* (2013.01); *H01L 2221/68345* (2013.01); *H01L 2221/68359* (2013.01); *H01L 2223/6616* (2013.01); *H01L 2223/6627* (2013.01); *H01L 2223/6683* (2013.01); *H01L 2224/16227* (2013.01); *H01L 2924/1423* (2013.01); *H01L 2924/1903* (2013.01)

(58) Field of Classification Search
CPC .. H01L 23/66; H01L 23/5386; H01L 25/0655
See application file for complete search history.

(56) References Cited

U.S. PATENT DOCUMENTS

2016/0276727 A1* 9/2016 Dang ........................ H01Q 1/50
2018/0097269 A1* 4/2018 Dogiamis ............... G06F 1/182

* cited by examiner

*Primary Examiner* — Dale E Page
*Assistant Examiner* — Wilner Jean Baptiste
(74) *Attorney, Agent, or Firm* — Akona IP

(57) ABSTRACT

Embodiments may relate to a microelectronic package that includes a substrate signal path and a waveguide. The package may further include dies that are communicatively coupled with one another by the substrate signal path and the waveguide. The substrate signal path may carry a signal with a frequency that is different than the frequency of a signal that is to be carried by the waveguide. Other embodiments may be described or claimed.

12 Claims, 9 Drawing Sheets

WAVEGUIDE FAN-OUT

CROSS-REFERENCE TO RELATED APPLICATION

This application claims the benefit of Greek Patent Application Serial No. 20190100140, filed Mar. 22, 2019, entitled "WAVEGUIDE FAN-OUT," the entire contents of which are hereby incorporated by reference.

BACKGROUND

High-frequency communication may offer advantages in terms of bandwidth density and transmission distance over standard interconnects. Additionally, the high-frequency communication may not require complex integration of active and passive optical components as may be needed in optical communications.

DETAILED DESCRIPTION

Figure 1:
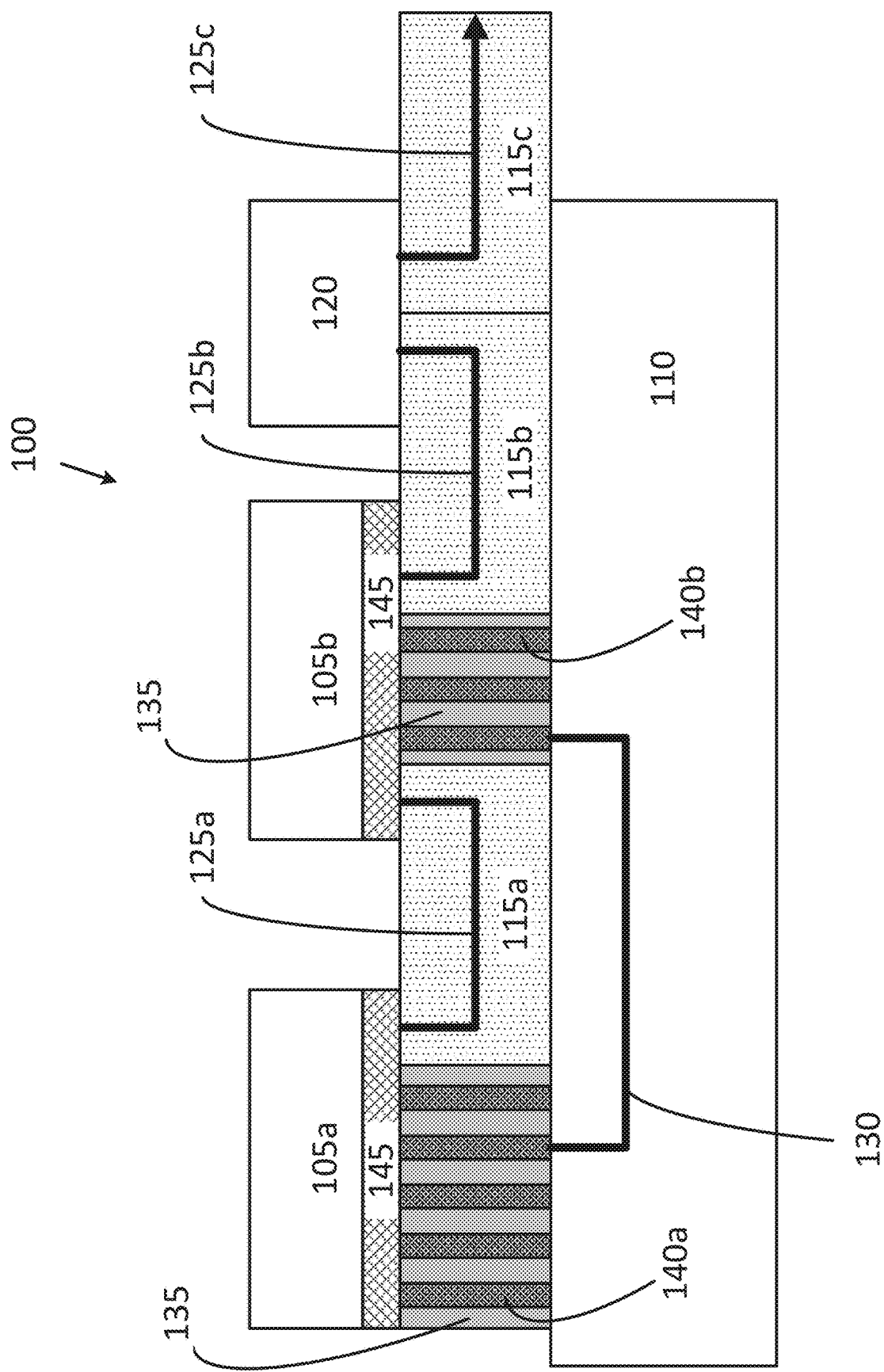
FIG. 1 illustrates an example microelectronic package with a fan-out structure, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabric.

As noted, high-frequency communication may offer significant advantages in terms of bandwidth density and transmission distance over legacy copper interconnects. The high-frequency communication may also not require complex integration of active or passive optical components as may be used in optical communications. As used herein, high-frequency communication may refer to electromagnetic signals with a frequency greater than approximately 30 gigahertz (GHz). In some embodiments, the frequency of the electromagnetic signals may be between approximately 30 GHz and approximately 300 GHz, which may also be referred to as millimeter-wave (mmWave) communication. In some embodiments, the frequency of the electromagnetic signals may be higher or lower than the above-described mmWave range. For example, in some embodiments the frequency may be greater than 300 GHz and on the order of 1 terahertz (THz) or above.

One challenge of transmissions at higher-frequencies, e.g., on the order of 300 GHz or above, may be that legacy packaging materials and transmission lines may be lossy at these frequencies. For example, some legacy materials or lines may have losses on the order of a several decibels to 10s of decibels (dB) per centimeter (cm) of transmission line. These losses may impact the overall link budget and the energy efficiency of the transmission.

To address these losses, embodiments herein may relate to a fan-out package-on-package (PoP) structure that may accommodate high-frequency transmission lines and connectors in addition to power delivery or low-frequency transmissions. As used herein, low-frequency transmissions may relate to transmissions with a frequency below approximately 30 GHz. Such low-frequency transmissions may include power signals (e.g., signals related to power or ground), or the low-frequency transmissions may be data transmissions in accordance with a protocol such as a double data rate (DDR) protocol, a peripheral component interconnect express (PCI-e) protocol, or some other protocol or transmission.

More generally, embodiments may relate to the use of a high-frequency fan-out process that may support relatively fine-pitch interconnects for the low-frequency transmissions, and low-loss waveguides for high-frequency transmissions. Embodiments may provide a variety of advantages. For example, embodiments may decouple high-frequency transmissions from the low-frequency transmissions (e.g., low-frequency data transmissions or power/ground transmissions as described above). This decoupling may allow the use of lower cost, high mechanical reliability materials or structures for the low-frequency signals while also allowing low-loss high-frequency package interconnects or materials for the high-frequency signals. Additionally, embodiments may allow direct integration of off-package connectors on the microelectronic package with lower loss or size requirements than legacy packages.

At a high level, FIG. 1 depicts an example microelectronic package 100 (which may also be referred to as a "semiconductor package") that may use a PoP architecture. Generally, the bottom package may allow for routing of power or low-frequency signals, while the top package supports routing of high-frequency signals.

The microelectronic package 100 may include a plurality of dies 105a/105b (collectively, dies 105). The dies 105 may be, for example, computer components that are configured to generate, receive, store, or otherwise process some type of data. For example, the dies 105 may be or may include a processor such as a central processing unit (CPU), graphics processing unit (GPU), a core of a distributed processor, or some other type of processor. The dies may also include a memory such as a DDR memory, a non-volatile memory (NVM), a volatile memory, a read-only memory (ROM), or some other type of memory or die.

Generally, as noted above, the dies 105 may be configured to communicate using one or both of a high-frequency signal and a low-frequency signal. Specifically, the dies 105 may include radio frequency (RF) circuitry 145 on the die 105 that is to transmit, receive, or process one or more high-frequency or low-frequency signals. Specifically, the RF circuitry 145 may receive a data signal from a logic of the die 105 and convert it to a high-frequency or low-frequency signal for propagation through the microelectronic package 100. The conversion may include one or more processes or techniques such as modulation, up-conversion, etc. Conversely, the RF circuitry 145 may receive a high-frequency or low-frequency signal, convert it and supply the resultant converted signal to a logic of the die. The conversion in this circumstance may include de-modulation, down-conversion, etc.

The microelectronic package 100 may further include a package substrate 110. The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, etc. The conductive elements may be either internal to, or on the surface of, the package substrate. Generally, the conductive elements may allow for the routing of signals through the package substrate 110, or between elements that are coupled to the package substrate 110 as will be described in further detail below. In some embodiments, the various conductive elements may form a low-frequency signal path 130 through the package substrate 110 as shown. It will be understood that although the low-frequency signal path 130 is shown as a generally simplified structure that includes two vias and a single trace, in other embodiments the low-frequency signal path 130 may include an additional number of elements such as additional vias, traces, etc. Also, in some embodiments the low-frequency signal path 130 may not be internal to the package substrate 110, but at least a portion of the low-frequency signal path 130 may be positioned on an external surface of the package substrate 110.

The dies 105 may be coupled directly with the package substrate 110 in some embodiments, whereas in other embodiments one or more of the dies 105 may be coupled with the package substrate 110 using one or more interconnects 140a/140b as shown (collectively, interconnects 140). The interconnects 140 may physically or communicatively couple the dies 105 to the package substrate 110. For example, in some embodiments, one or more of the interconnects 140 may couple with a conductive element such as a pad, trace, or via of the die 105. The conductive element of the die 105 may receive a low-frequency signal from the RF circuitry 145, and convey that low-frequency signal to the interconnect 140. The interconnect 140 may also couple with a similar conductive element on the package substrate 110 and, through that conductive element, be communicatively coupled with the low-frequency signal path 130 such that the interconnect 140 may convey the low-frequency signal to the low-frequency signal path 130. In other embodiments, one or more of the interconnects 140 may not be coupled with a conductive element of the dies 105 or the package substrate 110, and rather they may physically couple the dies 105 to the package substrate 110 without communicatively coupling the dies 105 to the package substrate 110.

As depicted, the interconnects 140 may include one or more conductive pillars. In other embodiments, the interconnects 140 may be a different type connect such as a solder ball, a solder bump, a ball of a ball grid array (BGA), a pin of a pin grid array (PGA), an element of a land grid array (LGA) or some other type of interconnect. In some embodiments, an underfill 135 may be positioned between the dies 105 and the package substrate 110. The underfill 135 may be a dielectric material such as epoxy or some other appropriate underfill material. Generally, the underfill 135 may surround all or a portion of the interconnects 140, and occupy all or a portion of the space between the dies 105 and the package substrate 110. It will be understood that in some embodiments the underfill 135 may be considered to be an optional element and may not be present in the microelectronic package 100.

The microelectronic package 100 may further include one or more waveguides 115a, 115b, and 115c (collectively, waveguides 115). Generally, the waveguides 115 may be formed of a dielectric material such as polytetrafluoroethylene (PTFE), polyethylene (PE), polystyrene, cyclic-olefin-copolymers (CoC), fluoropolymers such as fluorinated ethylene propylene (FEP), Ethylene tetrafluoroethylene (ETFE), Polyvinylidene fluoride (PVDF), or some other dielectric material that may allow for relatively efficient and low-loss propagation of high-frequency electromagnetic signals. The waveguides 115 may include a high-frequency signal path 125a/125b/125c (collectively, high-frequency signal paths 125). Generally, a waveguide such as waveguide 115a may be communicatively coupled with the dies 105a and 105b. More specifically, the high-frequency signal path 125a of the waveguide 115a may be communicatively coupled with the RF circuitry 145 of the dies 105a and 105b.

The RF circuitry 145 may be configured to generate and launch a high-frequency signal into the waveguide 115a. Specifically, the RF circuitry 145 may include one or more signal launchers such as opposing metal plates, or some other type of signal launcher such as microstrip-to-tapered slotline launcher, a leaky-wave planar launcher, that is configured to receive an electronic signal and convert the electronic signal to a spatial form that is suitable for propagation through the waveguide 115a. The signal launchers may additionally or alternatively be configured to receive a high-frequency electronic signal from the waveguide 115 and convert the signal to a mode that is suitable for communication to the die 105. As noted in some embodiments the signal launcher may be an element of the die 105, however in other embodiments the signal launcher may be external to the die and, for example, located in an external element that is coupled to the package substrate 110 adjacent to the waveguide 115a and communicatively coupled to the RF circuitry 145 of one or both of the dies 105. The location and configuration of the signal launcher may be based on, for example, design considerations, space or cost constraints, etc. of the microelectronic package. In general, it will be understood that the physical depiction of the high-frequency signal paths 125 is intended as an example of the existence of the path, and in other embodiments the high-frequency signal paths 125 may not bend, or may not bend in the exact dimension, as depicted in FIG. 1.

In some embodiments it may be desirable for the high-frequency signal to be transmitted off of the microelectronic package 100. For example, die 105b, and particularly the RF circuitry 145 of die 105b, may generate and transmit a high-frequency signal that is to be transmitted off of the microelectronic package. In this embodiment, the RF circuitry 145 may generate a high-frequency signal and transmit the signal into the waveguide 115b, and particularly the high-frequency signal path 125b of the waveguide 115b. In some embodiments, the high-frequency signal may transmit off of the microelectronic package 100 through a single waveguide. In other embodiments, a signal chain may be desirable. In these embodiments, the signal path 125b may couple with a connector 120, which in turn may couple with another waveguide 115c and particularly a high-frequency signal path 125c of the waveguide 115c. The connector 120 may include a variety of circuitry such as RF circuitry similar to RF circuitry 145, an amplifier, or other circuitry. Specifically, the connector 120 may receive the high-frequency signal from waveguide 115b, and then re-transmit the signal along waveguide 115c, with or without processing the signal in some way (e.g., signal amplification). It will be understood that in other embodiments a high-frequency signal may be received from off-package by waveguide 115c, and then transmitted to the die 105b (e.g., along high-frequency signal path 125c, to connector 120, to high-frequency signal path 125b, to die 105b).

Generally, in operation, the microelectronic package 100 may allow decoupling of transmission of high-frequency signals and low-frequency signals within the microelectronic package 100. Specifically, if die 105a is to transmit a high-frequency signal to die 105b, the die 105a, and particularly the RF circuitry 145 of the die 105a, may generate a high-frequency signal which may then be transmitted to die 105b through waveguide 115a, and particularly the high-frequency signal path 125a, as described above. Similarly, if the die 105a is to transmit a low-frequency signal to die 105b, then die 105a, and particularly the RF circuitry 145 of die 105a, may generate the low-frequency signal and transmit the signal to one of interconnects 140a. The signal may propagate through the interconnect 140a to low-frequency signal path 130. It may then traverse low-frequency signal path 130 to one of interconnects 140b where it may then travel to die 105b.

Additionally, in some embodiments other low-frequency signals such as power or ground signals may be provided to the dies 105 from package substrate 110 by one or more of interconnects 140. For example, in some embodiments the package substrate 110 may include or be coupled with one or more power supplies or be coupled to ground, and one or more of the interconnects 140 may be communicatively coupled with a power supply or ground.

It will be understood that FIG. 1 is intended as an example Figure that is to be used for the sake of discussion of various elements of this disclosure. Other embodiments of this disclosure may have variations from what is depicted in FIG. 1. For example, some embodiments may have more or fewer interconnects, dies, waveguides, etc. In some embodiments one or more of the waveguides 115 may be positioned at least partially between one or more of the dies 105 and the package substrate 110. In other embodiments, one or more of the dies 105 may be adjacent to a waveguide. For example, the die 105 may be coupled directly with the package substrate 110 adjacent to the waveguide 115, or the waveguide 115 may be coupled with the package substrate 110 via one or more interconnects such as interconnects 140. Additionally, as noted, in some embodiments a connector such as connector 120, underfill such as underfill 135, or some other elements depicted in FIG. 1 may not be present. In some embodiments, an overmold material may be present and at least partially surround one or more of the dies 105, the connector 120, or a waveguide 115. It will also be noted that although FIG. 1 depicts what may be referred to as an "edge-launch" architecture, other embodiments may provide for communication in a variety of different directions, including perpendicularly to the face of the package substrate 110 rather than generally parallel to the face of the package substrate 110 as depicted in FIG. 1.

As noted, FIG. 1 is intended as an example depiction, and as such the dimensions of one or more of the elements depicted, either actual dimensions or relative dimensions, may be different in a different embodiment. For example, certain elements may be wider, narrower, shorter, taller, longer, etc. than depicted in FIG. 1.

FIGS. 2-7 illustrate stages of manufacture of an example die package 201a/201b (collectively, die package 201) with a fan-out structure, in accordance with various embodiments. Generally, die package 201b may be considered a top view of the die package at various stages of manufacture, while die package 201a may be considered a cut-away side view of die package 201b along line A-A.

Figure 2:
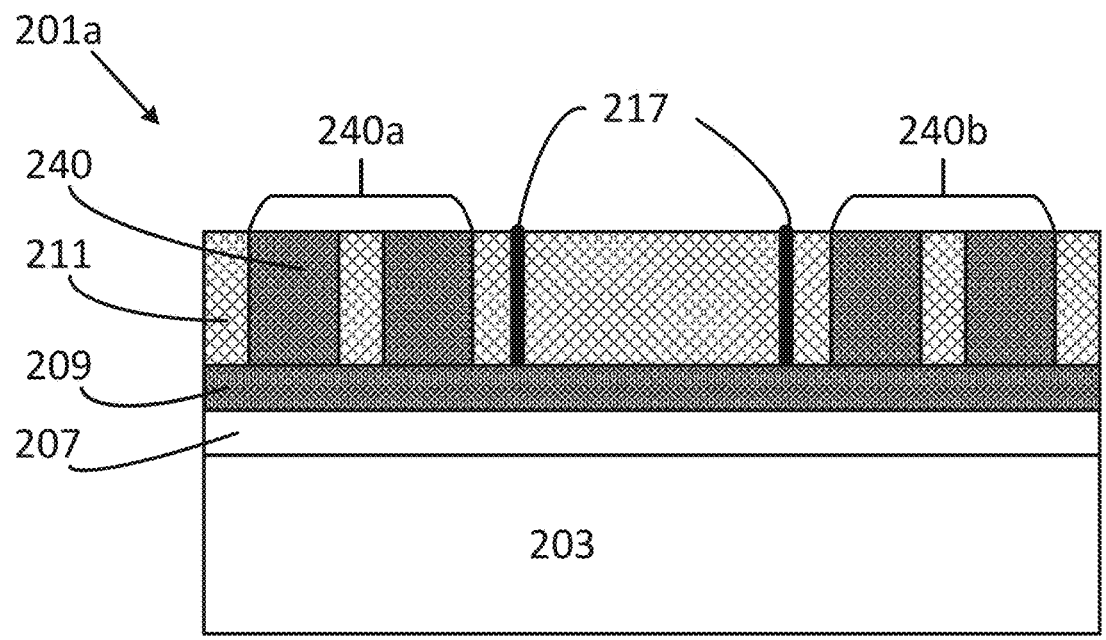
FIG. 2 illustrates a stage of manufacture of an example die package with a fan-out structure, in accordance with various embodiments.
Figure 2:
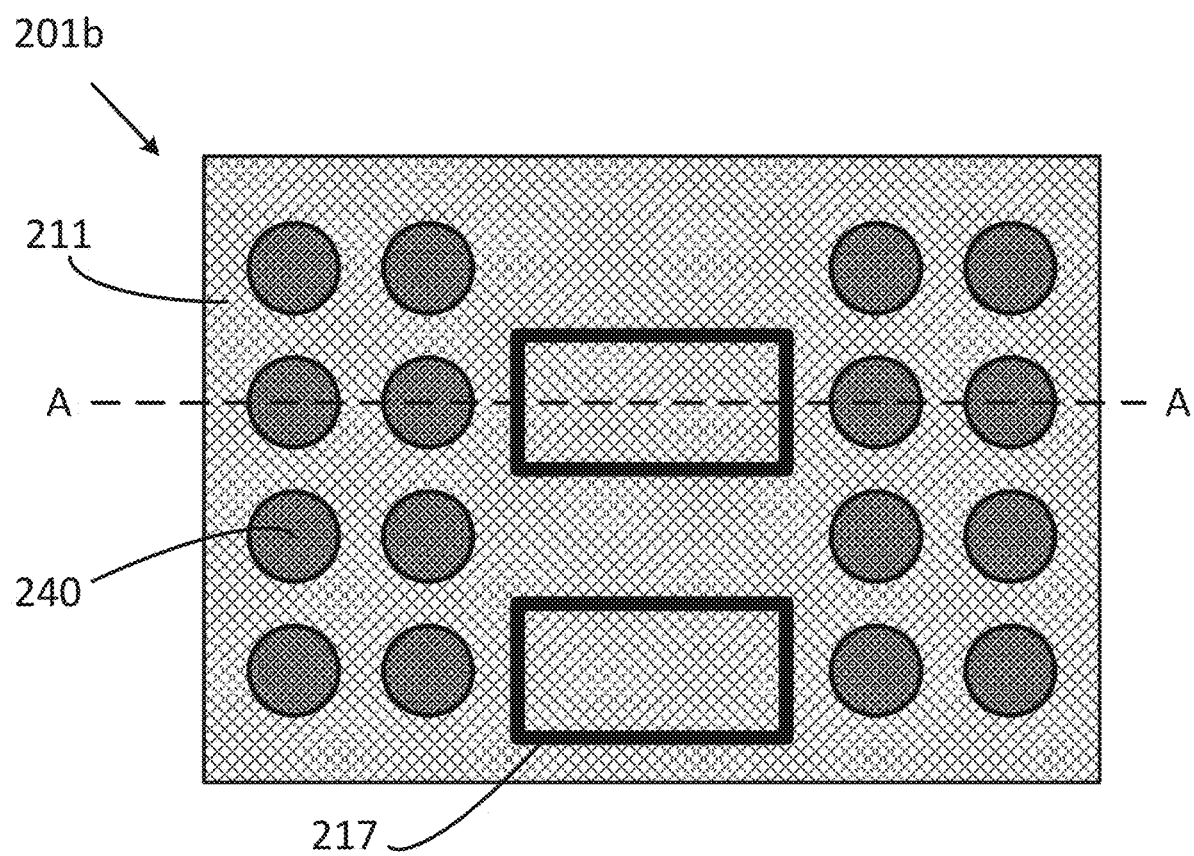

Generally, FIG. 2 illustrates an initial stage of manufacture of the die package 201. The initial stage may include a carrier layer 203 with a release layer 207 thereon. The carrier layer 203 may be, for example, a plastic carrier, a metal carrier, or some other carrier. The release layer 207 may be, for example, an adhesive layer or some other type of layer. Generally, at the end of the manufacturing technique, the release layer 207 and the carrier layer 203 may be removed from the remainder of the die package 201.

The die package 201 may further include a seed layer 209. The seed layer 209 may be, for example a copper seed layer or a seed layer formed of some other material that is to be used for the interconnects (as described below). Generally, the carrier layer 203, the release layer 207, and the seed layer 209 may be formed through a variety of processes or techniques such as deposition, lamination, slid coating, spin coating, pick-and-place techniques, etc. For example, the carrier layer 203 may initially be formed, then the release layer 207 may be formed atop the carrier layer 203 through, for example, deposition or some other technique. The seed layer 209 may then be formed atop the release layer 207 through, for example, deposition or some other technique. It will be understood that different techniques may be used for different ones of the layers 203/207/209, or the same technique may be used for one or more of the layers 203/207/209.

A photo-imageable dielectric (PID) layer 211 may then be positioned atop the seed layer 209. Similarly to the above-described layers, the PID layer 211 may be positioned through lamination, deposition, etc. The PID layer 211 may then be exposed and developed to form one or more cavities. For example, a mask may be positioned over the PID layer 211, and the PID layer 211 may be exposed to light which may optically activate portions of the PID layer 211 that can later on be developed to form the cavities. It will be understood, however, that the development may be performed in a different manner in other embodiments, for example through chemical etching, mechanical etching, etc.

Various elements may then be positioned in the resultant cavities. Such elements may include interconnects 240 and waveguide sidewalls 217. Specifically, the seed layer 209 may be used as the basis to generate interconnects 213, which may be similar to, and share one or more characteristics of, interconnects 140 of FIG. 1. Specifically, the interconnects 213 may be formed via plating, deposition or some other technique. It will be understood that although the interconnects 213 are depicted as being generally vertical and having a circular cross-section, in other embodiments the sides of the interconnects 213 may be sloped or otherwise irregular, and the interconnects 213 may have a different cross-section such as oblong, rectangular, square, etc. Similarly, the waveguide sidewalls 217 may be formed in the resultant cavities through a technique such as deposition, plating, etc.

It will be noted that although the waveguide sidewalls 217 are depicted as being generally rectangular with relatively sharp corners in the top view of the die package 201b, and having generally vertical sidewalls in the view of package 201a, in other embodiments the waveguide sidewalls 217 may have a different shape such as curved, sloped, etc. Additionally, the waveguide sidewalls 217 may not be rectangular, or the corners of the sidewalls may not be as sharp or well-defined as depicted in the Figure. It will also be noted that although the interconnects 240 are depicted as being external to the waveguide sidewalls 217, in other embodiments there may be one or more interconnects 240 that at least partially overlap, or are positioned within (i.e., partially or fully surrounded by in the view of die package 201b) the waveguide sidewalls 217. Additionally, it will be noted that the interconnects 240 are depicted as including a first interconnect group 240a and a second interconnect group 240b, however in other embodiments the interconnects 240 may be arranged in accordance with a different pattern or grouping.

Figure 3:
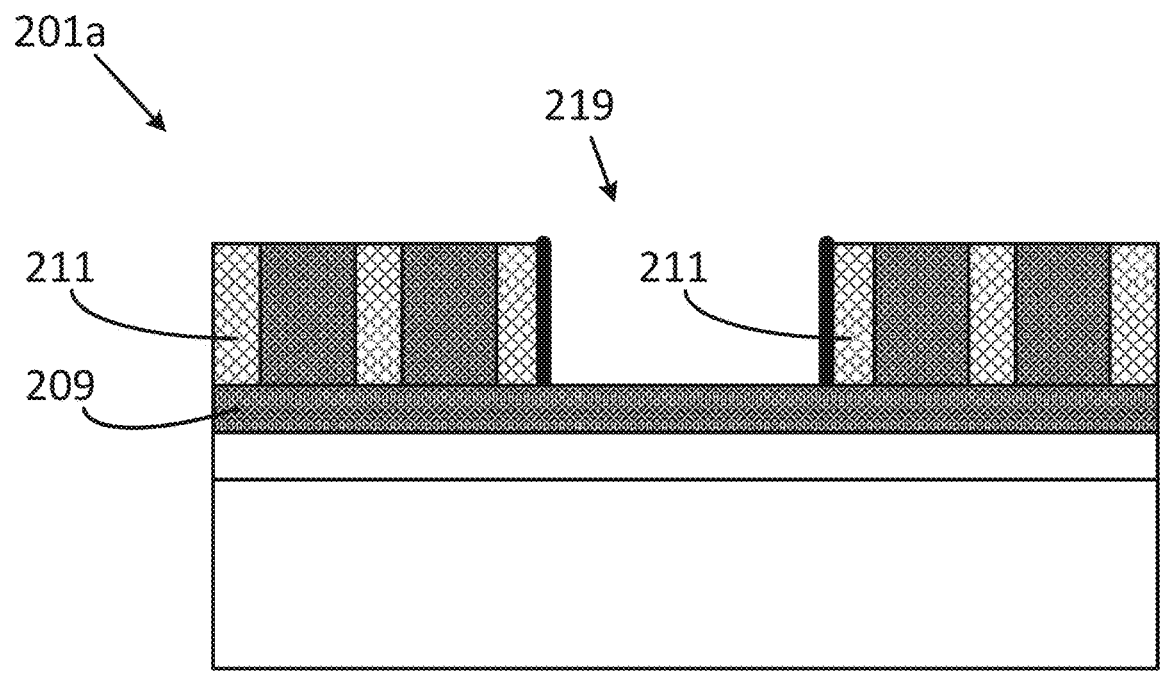
FIG. 3 illustrates another stage of manufacture of the example die package of FIG. 2, in accordance with various embodiments.
Figure 3:
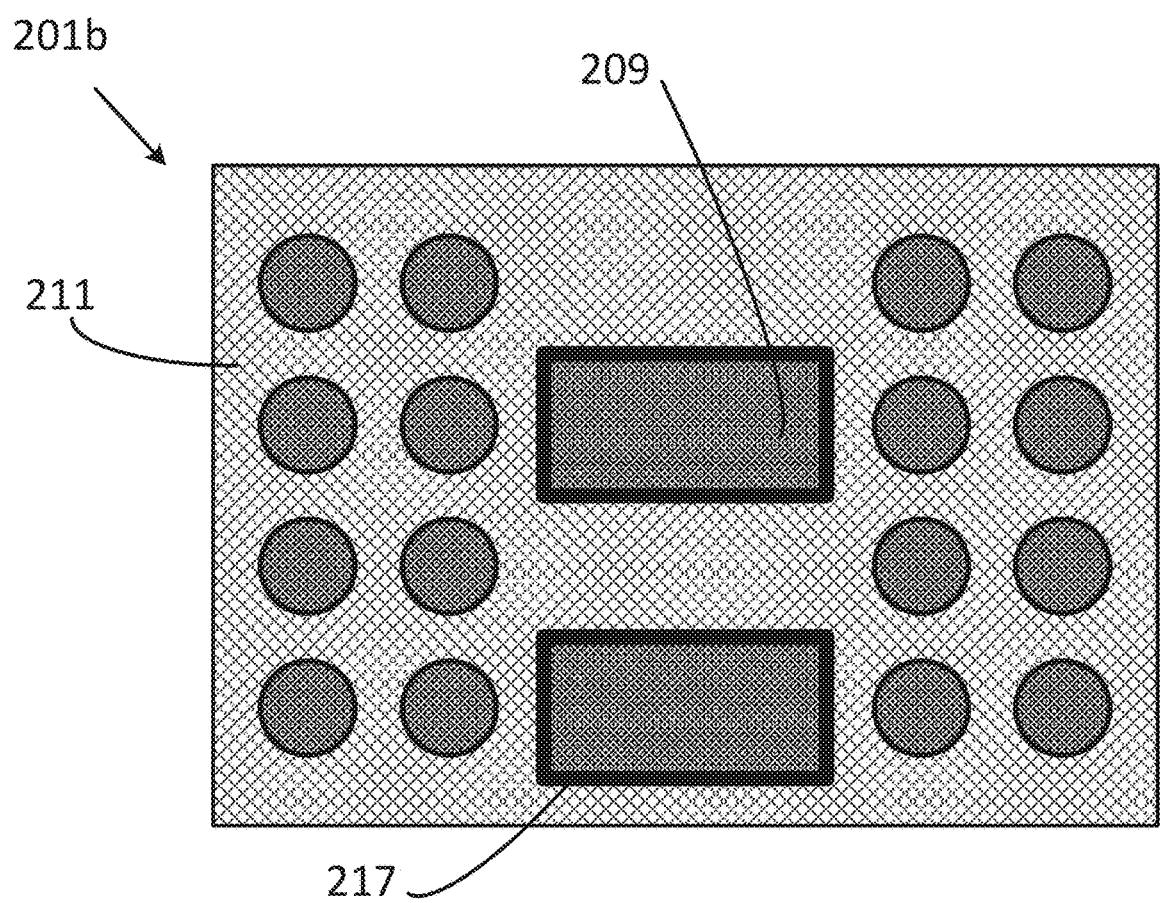

As shown in FIG. 3, a portion of the PID layer 211 may be removed to form a cavity 219. Specifically, the removal of the portion of the PID layer 211 may be done through chemical etching (with or without a mask), using double development or double exposure photo resist (PR), or some other technique. For example, the double development or double exposure PR may include wavelength selective development, dose selective development, a grayscale mask, etc. As can be seen in FIG. 3, removal of the portion of the PID layer 211 may result in exposure of the seed layer 209 within the cavity 219. In some embodiments, at this stage of manufacture, the bottom walls of a waveguide may be positioned within the cavity 219 through, for example, placement, deposition, plating, etc. In other embodiments, as depicted in FIG. 3, the bottom walls of the waveguide may not be positioned within the cavity 219 at this stage.

Figure 4:
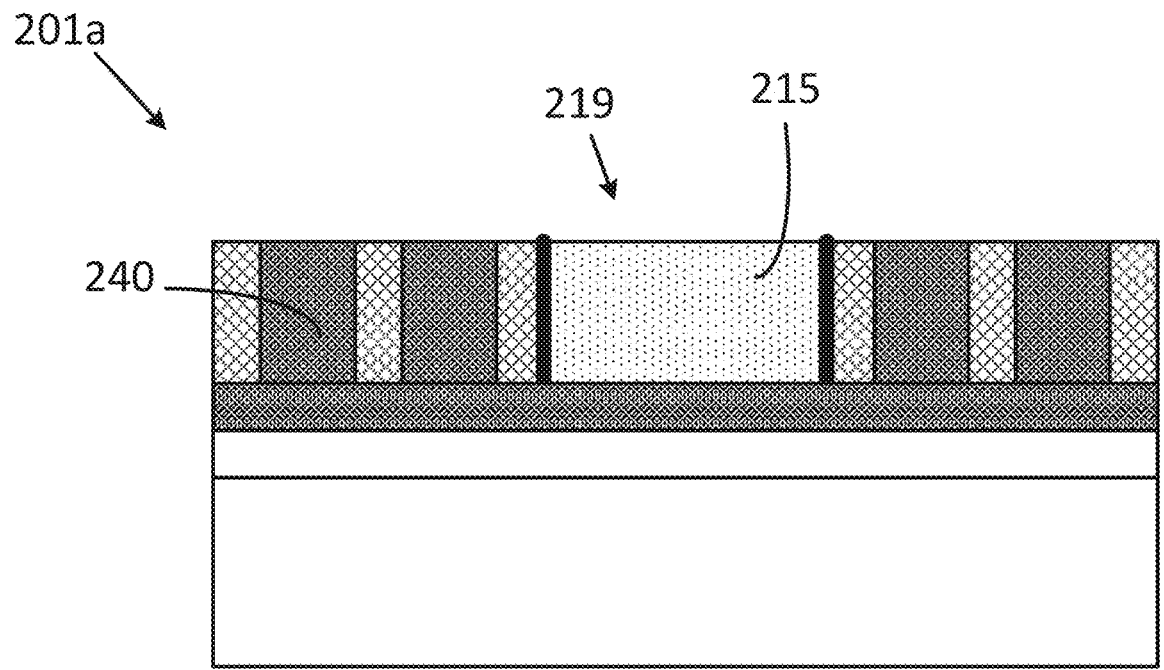
FIG. 4 illustrates another stage of manufacture of the example die package of FIG. 2, in accordance with various embodiments.
Figure 4:
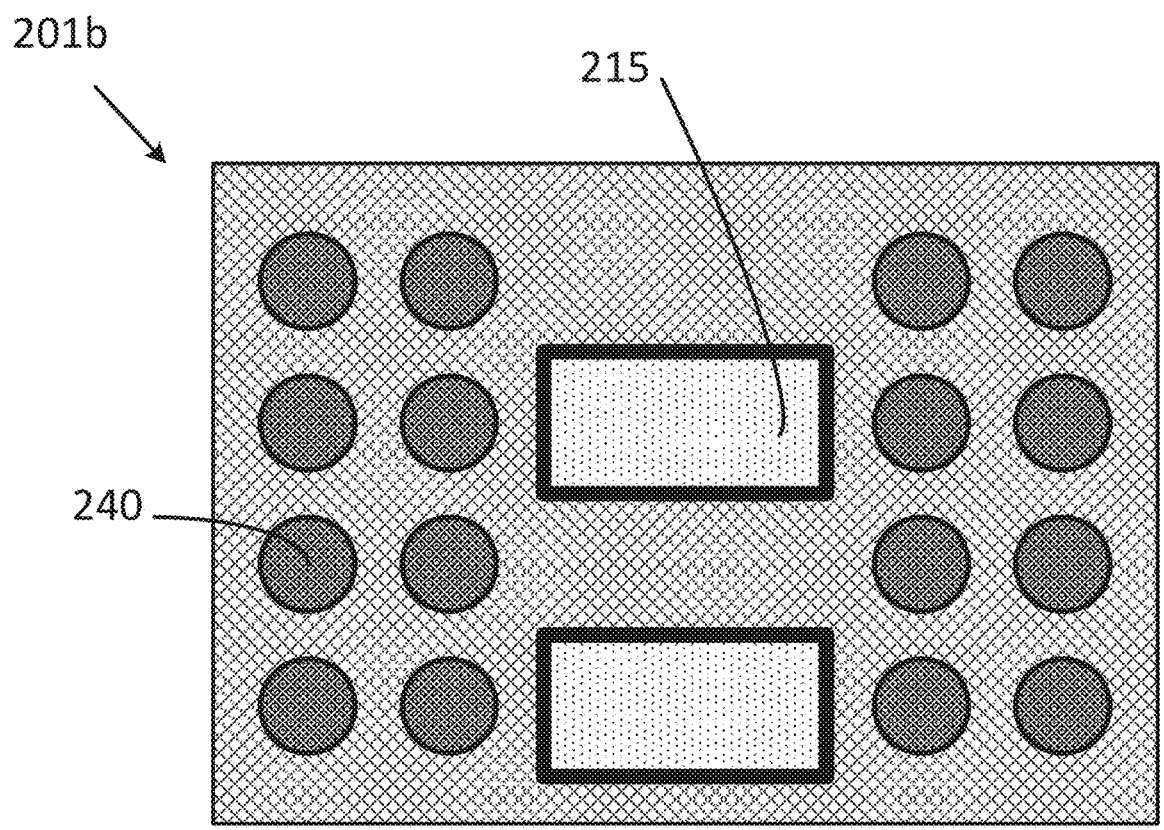

As shown in FIG. 4, a waveguide material 215 may then be positioned within the cavity to form a waveguide which may be similar to, and share one or more characteristics of, waveguide 115. The waveguide material 215 may be positioned within the cavity through, e.g., deposition, lamination, dispensation, stencil printing, screen printing, etc. Generally, the waveguide material 215 may be a low-loss dielectric material such as the low-loss dielectric materials described above with respect to waveguide 115. In other embodiments, the waveguide material 215 may be a sacrificial material such as photoresist materials, thermally decomposable organic polymers, etc. At this stage, the top portion of the die package (for example, as oriented in the view of die package 201a) may be ground or otherwise processed to ensure that the interconnects 240 are exposed.

Figure 5:
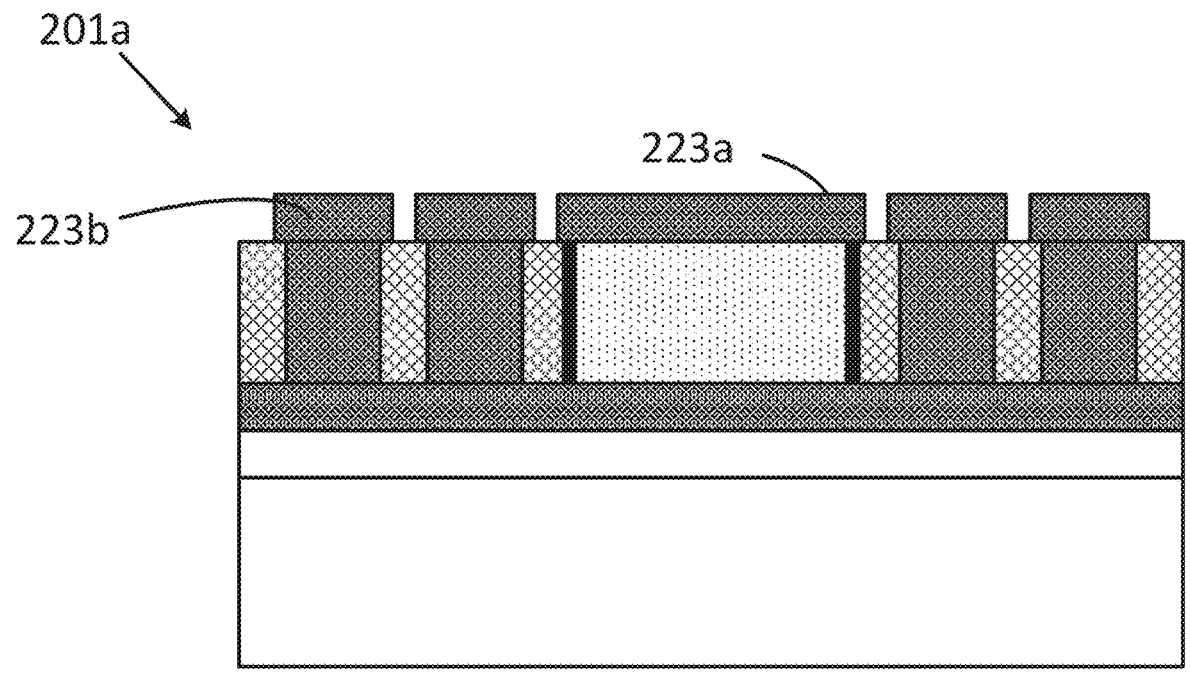
FIG. 5 illustrates another stage of manufacture of the example die package of FIG. 2, in accordance with various embodiments.
Figure 5:
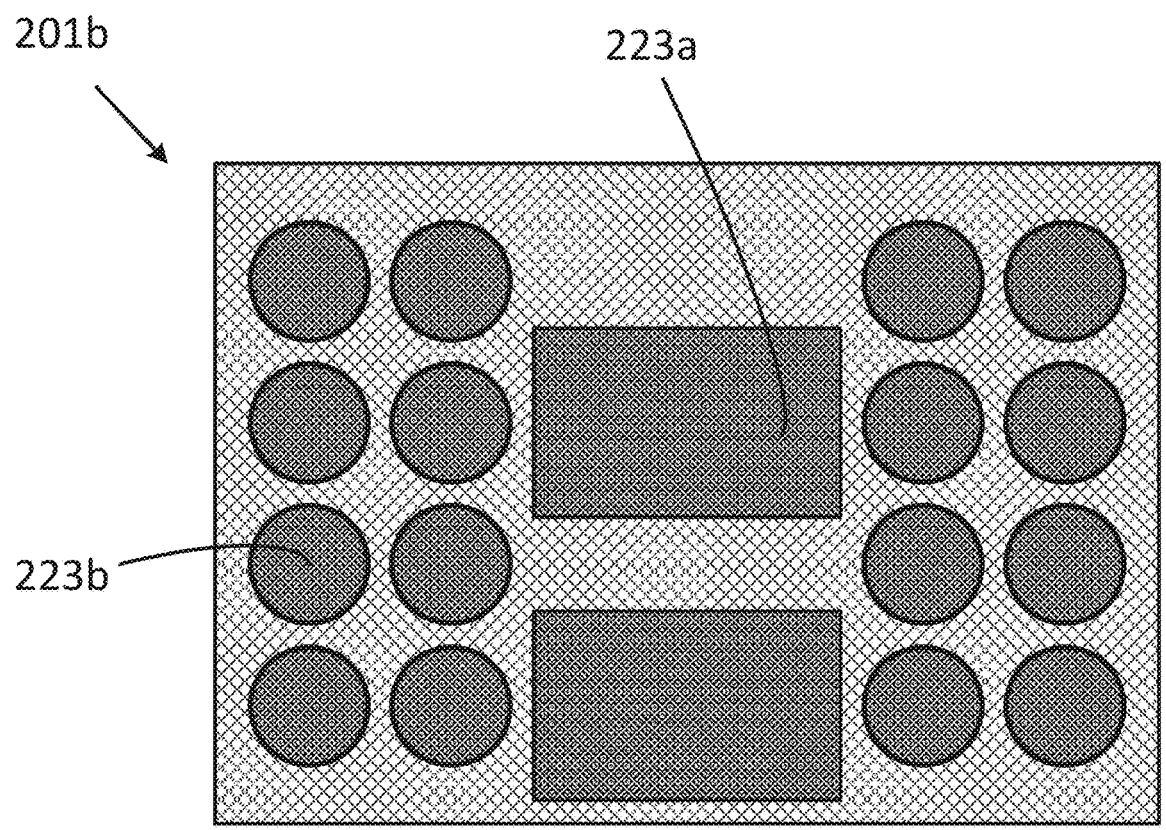

As can be seen in FIG. 5, a redistribution layer (RDL) may then be positioned on the top side of the die package 201 (e.g., as oriented with respect to the view of die package 201a). Specifically, the RDL may provide pads 223b which may serve to physically and communicatively couple the interconnects 240 with a die that is positioned on the die package (as depicted and discussed below). The RDL may also provide a top side 223a of the waveguide as can be seen in FIG. 5. Generally, the pads 223b and the top side 223a may be positioned on the die package through a technique such as electroplating using a photoresist layer or mask, or some other technique. In some embodiments, although not explicitly shown in FIG. 5, the top side 223a of the waveguide may include one or more features which may be an element of a signal launcher as described above with respect to FIG. 1.

Figure 6:
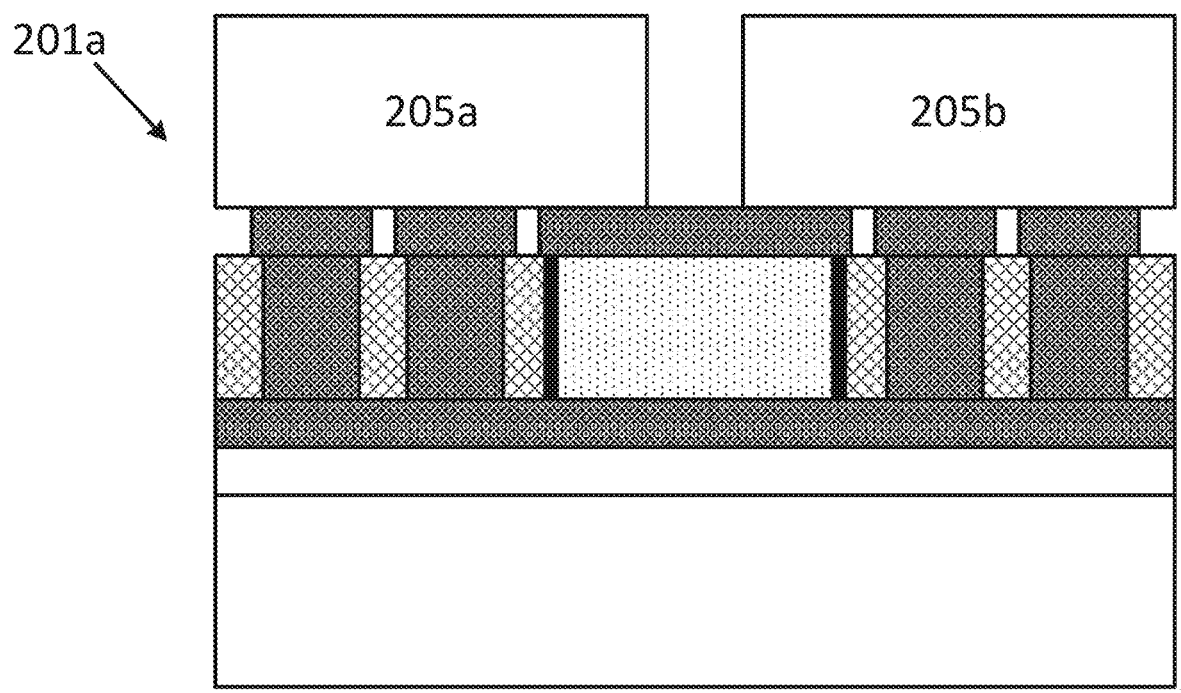
FIG. 6 illustrates another stage of manufacture of the example die package of FIG. 2, in accordance with various embodiments.
Figure 6:
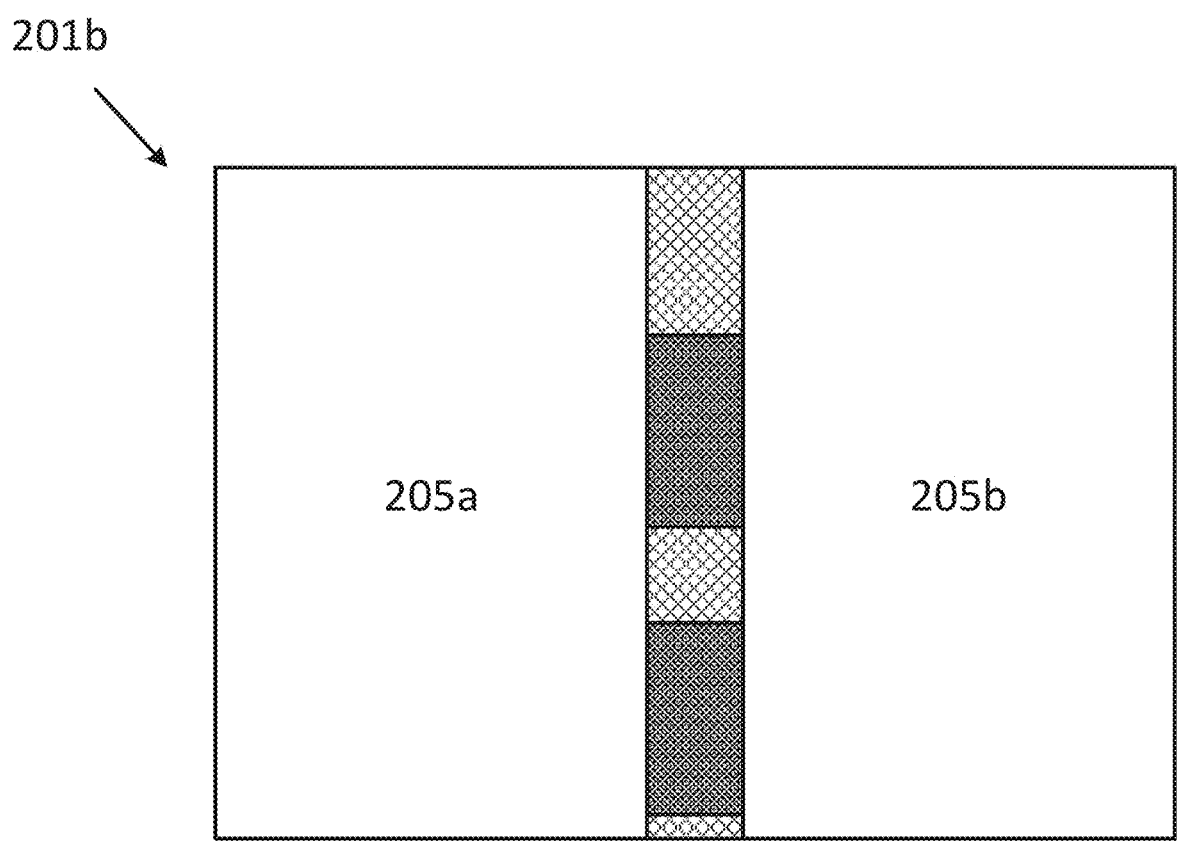

As can be seen in FIG. 6, dies 205a and 205b (collectively dies 205) are then attached to the die package 201, and particularly to the pads 223b and the top side 223a. The dies 205 may be similar to, and share one or more characteristics of, dies 105. In some embodiments, an overmold material may further be positioned on the die package 201. The overmold material may at least partially surround the dies 205, the pads 223*b*, the top side 223*a*, or some other element of the die package. However, the overmold material is not depicted in FIG. 6 for the sake of clarity of views of the Figure.

Figure 7:
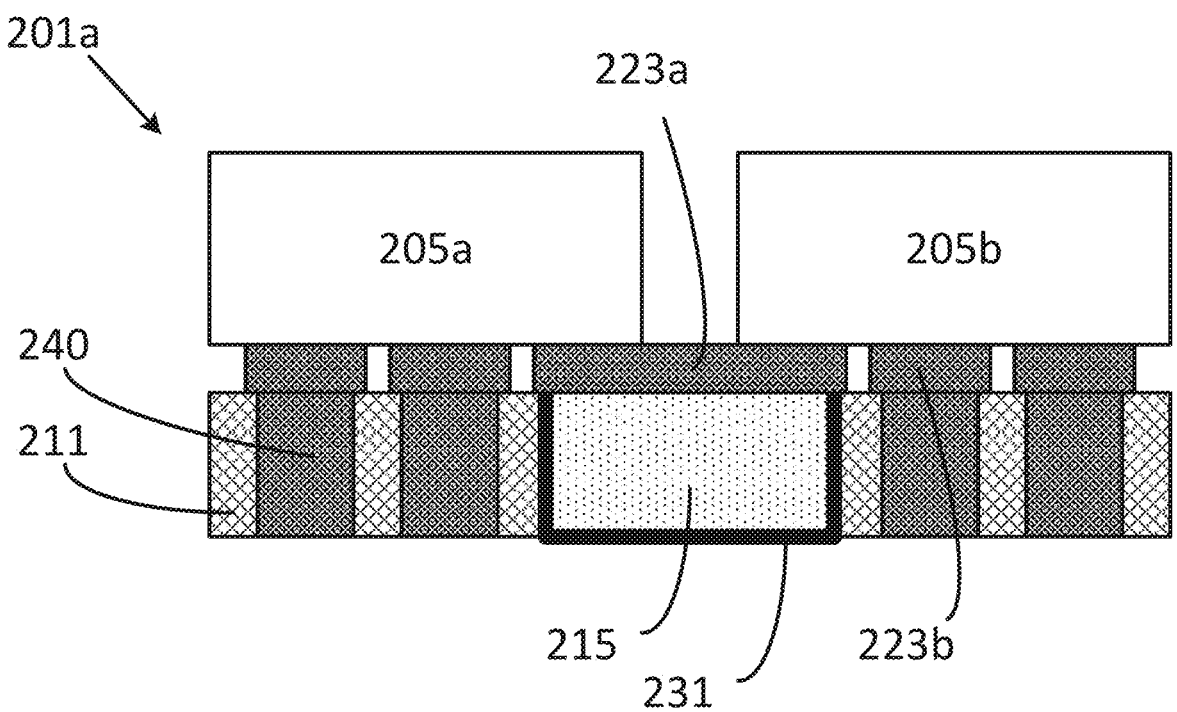
FIG. 7 illustrates another stage of manufacture of the example die package of FIG. 2, in accordance with various embodiments.
Figure 7:
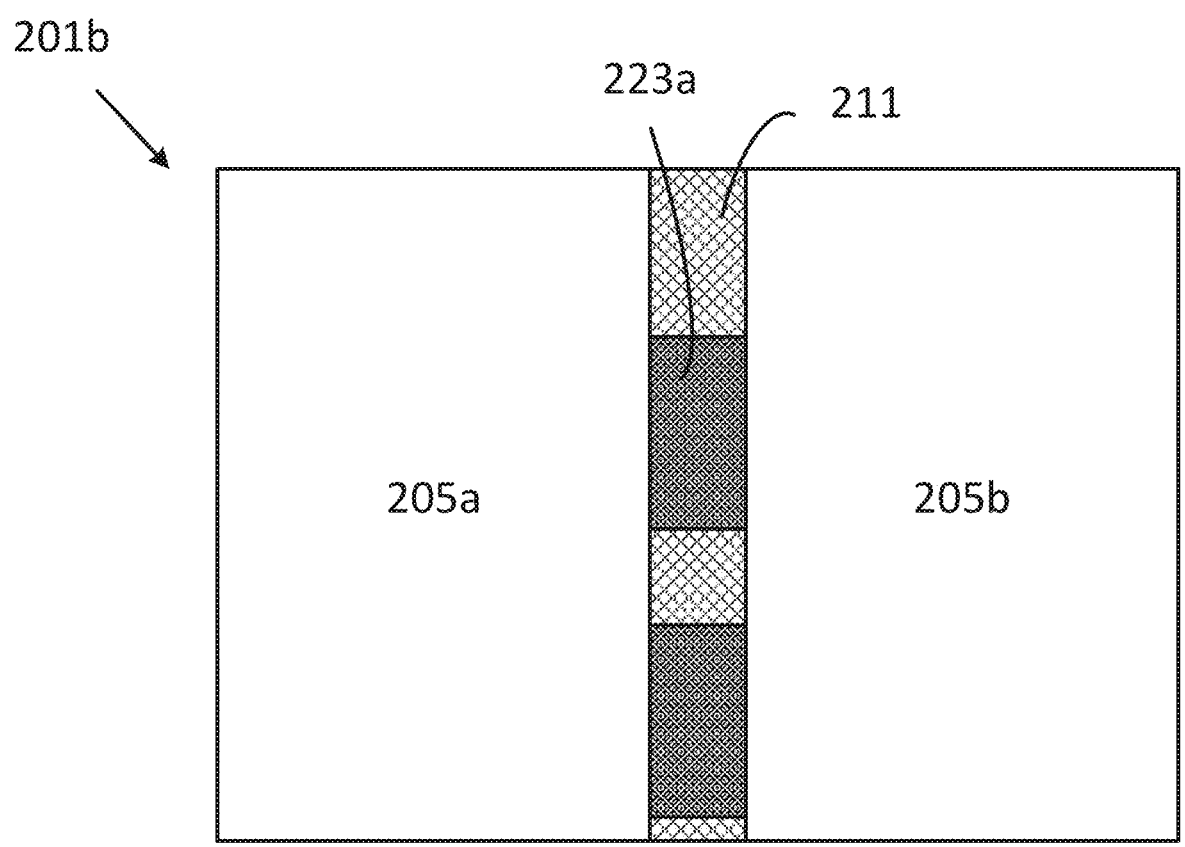

As can be seen in FIG. 7, one or more of the carrier layer 203, release layer 207, and seed layer 209 may be removed from the die package 201. In some embodiments, this removal may be referred to as "releasing" the die package 201. In various embodiments, one or more of the layers may be removed from the die package 201 through, for example, mechanical or chemical etching, grinding, peeling, or some other form of removal of one or more of the layers.

As can be seen in FIG. 7, subsequent to the removal of the various layers from the die package 201, the waveguide 215 may include a bottom wall 231. The bottom wall 231 may be formed through a variety of techniques in various embodiments. For example, in one embodiment, the bottom wall may be formed as described above with respect to FIG. 3. In this embodiment, then removal of the seed layer 209 may include use of a flash etch which may remove the seed layer 209 but the bottom wall 231 may remain.

In another embodiment, if the bottom wall 231 was not positioned in the cavity 219 at FIG. 3, then a masked etch may be used to remove the seed layer 209 from the die package 201. However, the mask may prevent removal of the bottom wall 231 from the die package 201, leaving the bottom wall 231 as depicted in FIG. 7.

Alternatively, if a sacrificial material is used for the waveguide material 215 at FIG. 4, then at this stage the sacrificial material may be removed and replaced by a low-loss dielectric material as described above with respect to waveguide 115. For example, a fully-formed waveguide may be placed in the resultant cavity, or the low-loss dielectric material may be positioned within the cavity through deposition, lamination, etc. In this situation, the bottom wall 231 may then be positioned on the die package either concurrently with, or subsequently to, the positioning of the waveguide within the resultant cavity. In other embodiments, the low-loss dielectric material may not be replaced to have an air-filled waveguide.

Further stages of manufacture may then occur subsequent to FIG. 7. For example, the die package 201 may be diced to subdivide the die package 201 into smaller packages. In some embodiments, the dicing may be done in a rectangular shape for die-to-die interconnects. In other embodiments, the die package may be diced in a non-rectangular shape (e.g., as shown in FIG. 1) which may allow connectors to be attached directly to the waveguides (e.g., connector 120). The resultant die package 201 may then be coupled with a package substrate such as package substrate 110 to form a microelectronic package such as microelectronic package 100.

Similarly to FIG. 1, it will be understood that FIGS. 2-7 are intended as examples of a manufacturing technique in one embodiment, and other embodiments may vary. For example, the specific shapes of elements, dimensions of elements, numbers of elements, etc. may vary in other embodiments. Additionally, in some embodiments certain stages of manufacture may occur in a different order than discussed, or concurrently with one another. Other variations may be present in other embodiments.

Figure 8:
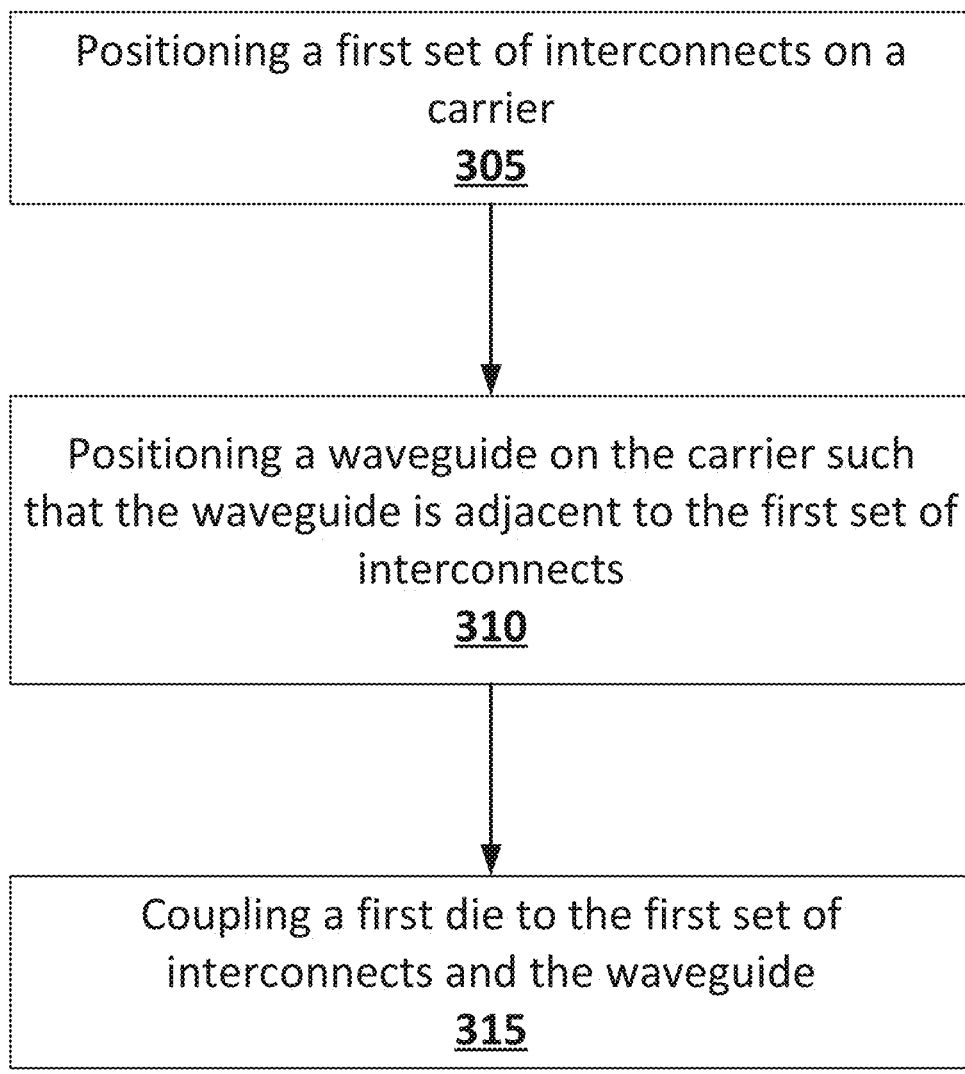
FIG. 8 illustrates an example technique for manufacturing a die package, in accordance with various embodiments.

FIG. 8 depicts an example technique by which a die package such as the die package 201 of FIG. 7 may be formed. It will be understood that this described technique is one high-level example embodiment. Other embodiments may include more or fewer elements, or the elements may be in a different order than described or depicted. In some embodiments, the technique may further include coupling the resultant die package to a package substrate such as package substrate 110 to form a microelectronic package such as microelectronic package 100.

The technique may include positioning, at 305, a first set of interconnects on a carrier. The carrier may be, for example, carrier layer 203. The interconnects may be similar to, for example, interconnect grouping 240*a* or 240*b*, or some other grouping of interconnects such as interconnects 240. In some embodiments the interconnects may be positioned directly on the carrier, while in other embodiments one or more layers such as a seed layer, a release layer, or some other layer may be positioned between the interconnects and the carrier.

The technique may further include positioning, at 310, a waveguide on the carrier such that the waveguide is adjacent to the first set of interconnects. The waveguide may be similar to, for example, waveguide material 215, waveguide 115, or some other type of waveguide or waveguide material. Similarly to the above-described interconnects, in some embodiments the waveguide may be positioned directly on the carrier while in other embodiments one or more layers may be positioned between the waveguide and the carrier.

The technique may further include coupling, at 315, a first die to the first set of interconnects and the waveguide. The die may be, for example, similar to die 205*a* or some other die described or discussed herein. In some embodiments the die may be adjacent to one or both of the waveguide or the interconnects, while in other embodiments one or both of the interconnects may be positioned in such a way that, when the die package is coupled with a package substrate, the waveguide and the interconnects are at least partially between the die and the package substrate.

Figure 9:
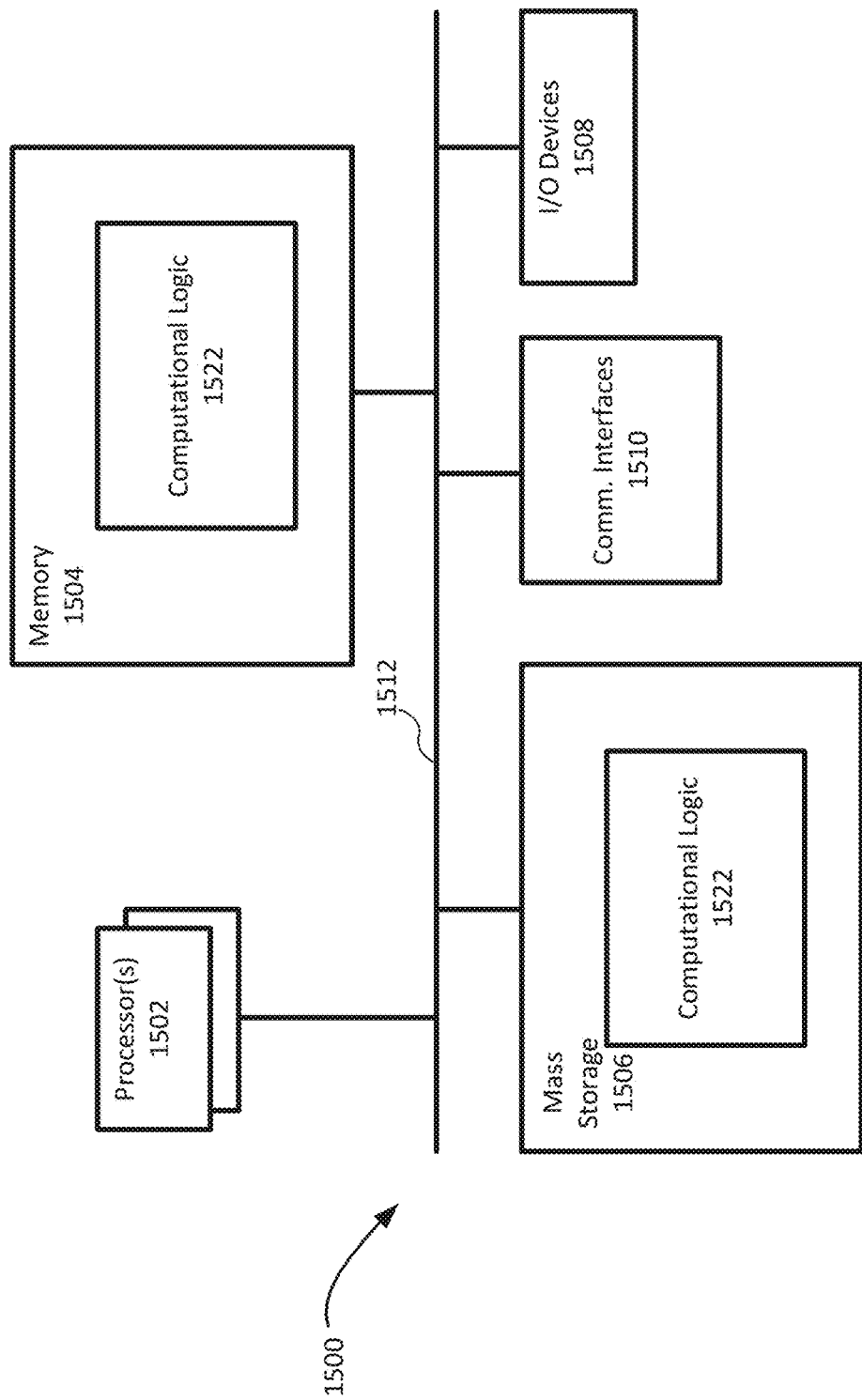
FIG. 9 illustrates an example device that may use various embodiments herein, in accordance with various embodiments.

FIG. 9 illustrates an example computing device 1500 suitable for use with microelectronic package 100, or some other microelectronic package in accordance with embodiments of this disclosure. Specifically, in some embodiments, the computing device 1500 may include one or more microelectronic packages such as microelectronic package 100, or some other microelectronic package, therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable read-only memory, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more microelectronic packages similar to microelectronic package 100 or some other microelectronic package related to embodiments herein. For example, in some embodiments the processor 1502, memory 1504, or some other component of the computing device 1500 may be a die of a microelectronic package such as one of dies 105, or some other die.

Examples of Various Embodiments

Example 1 includes a microelectronic package comprising: a package substrate that includes a face and a substrate signal path; a first die and a second die coupled with the package substrate and communicatively coupled with the substrate signal path; and a waveguide coupled with the face of the package substrate, wherein the waveguide is communicatively coupled with the first die and the second die; wherein the waveguide is to carry an electromagnetic signal with a first frequency from the first die to the second die, and the substrate signal path is to carry an electromagnetic signal with a second frequency from the first die to the second die, and wherein the first frequency is greater than the second frequency.

Example 2 includes the microelectronic package of example 1, wherein the substrate signal path is positioned between two dielectric layers of the package substrate.

Example 3 includes the microelectronic package of example 1, wherein the first frequency is greater than 30 gigahertz (GHz).

Example 4 includes the microelectronic package of any of examples 1-3, wherein the waveguide is coupled with the face of the package substrate through solder or adhesive.

Example 5 includes the microelectronic package of any of examples 1-3, wherein the electromagnetic signal with the second frequency is a power signal.

Example 6 includes the microelectronic package of any of examples 1-3, wherein the waveguide is positioned at least partially between the first die and the package substrate.

Example 7 includes the microelectronic package of any of examples 1-3, further comprising a plurality of conductive pillars that physically and communicatively couple the first die and the second die to the package substrate.

Example 8 includes a die package comprising: a first die and a second die adjacent to the first die; a waveguide with a first side and a second side, wherein the first side of the waveguide is coupled with a face of the first die and a face of the second die, wherein the waveguide is to convey an electromagnetic signal with a first frequency from the first die to the second die; and a first set of interconnects coupled with the face of the first die and adjacent to the waveguide, wherein the first set of interconnects is to carry an electromagnetic signal with a second frequency from the first die, and wherein the second frequency is less than the first frequency.

Example 9 includes the die package of example 8, wherein the first frequency is greater than 30 gigahertz (GHz).

Example 10 includes the die package of example 8, further comprising a second set of interconnects coupled with the face of the second die.

Example 11 includes the die package of any of examples 8-10, wherein the die package is to couple with a package substrate such that the waveguide is at least partially positioned between the first die and the package substrate.

Example 12 includes the die package of example 11 wherein, when the die package is coupled with the package substrate, a signal path of the package substrate is to carry the electromagnetic signal with the second frequency from the first die to the second die.

Example 13 includes the die package of any of examples 8-10, further comprising a carrier coupled with the waveguide and the first set of interconnects.

Example 14 includes a method of forming a die package, the method comprising: positioning a first set of interconnects on a carrier; positioning a waveguide on the carrier such that the waveguide is adjacent to the first set of interconnects; and coupling a first die to the first set of interconnects and the waveguide, wherein the first die is to send a low-speed signal with a first frequency through the first set of interconnects, and the first die is to send a high-speed signal with a second frequency through the waveguide, and wherein the second frequency is greater than the first frequency.

Example 15 includes the method of example 14, wherein the high-speed signal is a millimeter-wave (mmWave) signal.

Example 16 includes the method of example 14, wherein the high-speed signal has a frequency of greater than 300 gigahertz (GHz).

Example 17 includes the method of any of examples 14-16, further comprising: positioning a second set of interconnects on the carrier adjacent to the waveguide; and coupling a second die to the second set of interconnects and the waveguide, wherein the second die is to receive the high-speed signal from the first die via the waveguide.

Example 18 includes the method of example 17, further comprising: removing the carrier; and coupling the first set of interconnects, the second set of interconnects, and the waveguide to a package substrate such that the first set of interconnects and second set of interconnects are communicatively coupled to a signal path of the package substrate.

Example 19 includes the method of example 18, wherein the signal path is to carry the low-speed signal from the first set of interconnects to the second set of interconnects.

Example 20 includes the method of any of examples 14-16, wherein the low-speed signal is a power signal.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package comprising:
a package substrate that includes a face and a substrate signal path, wherein the substrate signal path is positioned between two dielectric layers of the package substrate;
a first die and a second die coupled with the package substrate and communicatively coupled with the substrate signal path; and
a waveguide coupled with the face of the package substrate, wherein the waveguide is communicatively coupled with the first die and the second die;
wherein the waveguide is to carry an electromagnetic signal with a first frequency from the first die to the second die, and the substrate signal path is to carry an electromagnetic signal with a second frequency from the first die to the second die, and wherein the first frequency is greater than the second frequency.

2. The microelectronic package of claim 1, wherein the first frequency is greater than 30 gigahertz (GHz).

3. The microelectronic package of claim 1, wherein the waveguide is coupled with the face of the package substrate through solder or adhesive.

4. The microelectronic package of claim 1, wherein the electromagnetic signal with the second frequency is a power signal.

5. The microelectronic package of claim 1, wherein the waveguide is positioned at least partially between the first die and the package substrate.

6. The microelectronic package of claim 1, further comprising a plurality of conductive pillars that physically and communicatively couple the first die and the second die to the package substrate.

7. A package comprising:
a first die and a second die adjacent to the first die;
a waveguide with a first side and a second side, wherein the first side of the waveguide is coupled with a face of the first die and a face of the second die, wherein the waveguide is to convey an electromagnetic signal with a first frequency from the first die to the second die; and
a first set of interconnects coupled with the face of the first die and adjacent to the waveguide, wherein the first set of interconnects is to carry an electromagnetic signal with a second frequency from the first die, and wherein the second frequency is less than the first frequency; and
a package substrate that includes a substrate signal path coupled to one of the first set of interconnects, wherein the substrate signal path is positioned between two dielectric layers of the package substrate.

8. The package of claim 7, wherein the first frequency is greater than 30 gigahertz (GHz).

9. The package of claim 7, further comprising a second set of interconnects coupled with the face of the second die.

10. The package of claim 7, wherein the waveguide is at least partially positioned between the first die and the package substrate.

11. The package of claim 10 wherein the substrate signal path of the package substrate is to carry the electromagnetic signal with the second frequency from the first die to the second die.

12. The package of claim 7, further comprising a carrier coupled with the waveguide and the first set of interconnects.

\* \* \* \* \*